(12) United States Patent
Ridgers

(10) Patent No.: US 6,236,268 B1
(45) Date of Patent: May 22, 2001

(54) HIGH-GAIN AMPLIFIER HAVING A LIMITED OUTPUT DYNAMIC RANGE

(75) Inventor: Timothy Ridgers, Bretteville L'Orgueilleuse (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/179,291

(22) Filed: Oct. 27, 1998

(30) Foreign Application Priority Data

Oct. 28, 1997 (FR) .................................................. 97 13509

(51) Int. Cl.[7] .................................................. H03F 3/45
(52) U.S. Cl. ............................................ 330/252; 330/254
(58) Field of Search .................................. 330/129, 254, 330/252; 327/359

(56) References Cited

U.S. PATENT DOCUMENTS 4,864,248 * 9/1989 Jansen ................................... 330/254
6,163,235 * 12/2000 Klemmer ......................... 330/110 X

OTHER PUBLICATIONS

By Messrs. Gray and Meyer, "Analysis and Design of Analog Integrated Circuits" pp. 228–229.

* cited by examiner

Primary Examiner—Steven J. Mottola
(74) Attorney, Agent, or Firm—Dicran Halajian

(57) ABSTRACT

The present invention relates to an amplifier comprising two transistors (Q1,Q2) arranged as a differential pair. According to the invention, a switch system for switching current and splitting up resistive branches ensures, in the case of unbalance of the differential pair (Q1, Q2), the conduction of the current flowing through each resistive branch towards the one of the two transistors (Q1) or (Q2) that is conductive. The gain and the maximum value of the amplitude of the output voltage of such an amplifier may thus be adjusted independently of each other.

5 Claims, 2 Drawing Sheets

HIGH-GAIN AMPLIFIER HAVING A LIMITED OUTPUT DYNAMIC RANGE

FIELD OF THE INVENTION

The present invention relates to an amplifier comprising a first and a second transistor arranged as a differential pair, each transistor having a bias terminal, a reference terminal connected to a current source and a transfer terminal connected to a supply terminal via a resistive branch, the bias terminals and the transfer terminals of the first and second transistors forming, respectively, a differential input and output, which are intended to receive and supply an input voltage and an output voltage respectively, a ratio between the values of the AC components of said voltages defining the gain of the amplifier.

BACKGROUND OF THE INVENTION

Such an amplifier, often called differential amplifier, is currently used in the integrated circuit industry. It is notably described in the title "Analysis and Design of Analog Integrated Circuits" by Messrs. Gray and Meyer. The gain and the maximum amplitude of the output voltage of this differential amplifier are both proportional to the product of the value of the impedance of the resistive branches and the value of the current supplied by the current source, called bias current. In certain applications, particularly radio signal receiving or processing applications in which the reduction of any form of noise which may affect the processed signals is an essential priority, this amplifier has for its function to perform both an amplification of a sinusoidal input voltage and its transformation into a square-wave output voltage. Such a transformation enables to avoid that the amplification introduces an additional noise component in the output voltage, which noise component is linked with the instantaneous value of the input voltage. Nevertheless, this transformation requires to have a high gain, so that the output voltage has edges which have such a steepness that the transitions they represent are well defined with time. This may be obtained by choosing a large value for the impedance of the resistive branch. Such a solution, however, has a major drawback: the effect of it is that the value of the maximum amplitude of the output voltage is increased considerably, which may provoke the saturation of circuits intended to receive said voltage and thus considerably disturb the operation of the system integrating the amplifier, which is unacceptable.

It is an object of the present invention to remedy this drawback to a large extent by proposing an amplifier whose gain and maximum value of the amplitude of the output voltage may be controlled independently of each other.

SUMMARY OF THE INVENTION

Indeed, an amplifier as defined in the opening paragraph is characterized according to the invention in that the resistive branches of the first and second transistors have each at least one intermediate terminal between a first and a second resistive element arranged in series, and in that each resistive branch is provided with a first element which permits the conduction of a current controlled by the potential of its intermediate terminal to its associated transistor when the latter is conductive, and with a second element which permits the conduction of a current to the other transistor of the differential pair when said other transistor is conductive.

In such an amplifier, the choice of a considerable resistance for the first resistive element will result in a high gain allowing a proper transformation of a sinusoidal input voltage into a square-wave output voltage, whereas a suitable choice of the resistance of the second resistive element will enable to limit the maximum amplitude of the output voltage to such a value that said voltage will be incapable of causing the circuits which are intended to receive the output voltage to be saturated.

In one of its embodiments, advantageous by the simplicity of its structure and the saving on components that is the result thereof, an amplifier according to the invention is characterized by claim 2.

The claims 3 and 4 offer particular embodiments of an amplifier according to the invention.

As explained above, an amplifier as described above may be advantageously utilized for processing radio signals. The invention thus also relates to a radio telephony device as claimed in claim 5.

BRIEF DESCRIPTION OF THE DRAWINGS

These and other aspects of the invention will be apparent from and elucidated with reference to the embodiments described hereinafter In the drawings.

DESCRIPTION OF PREFERRED EMBODIMENTS

Figure 1:
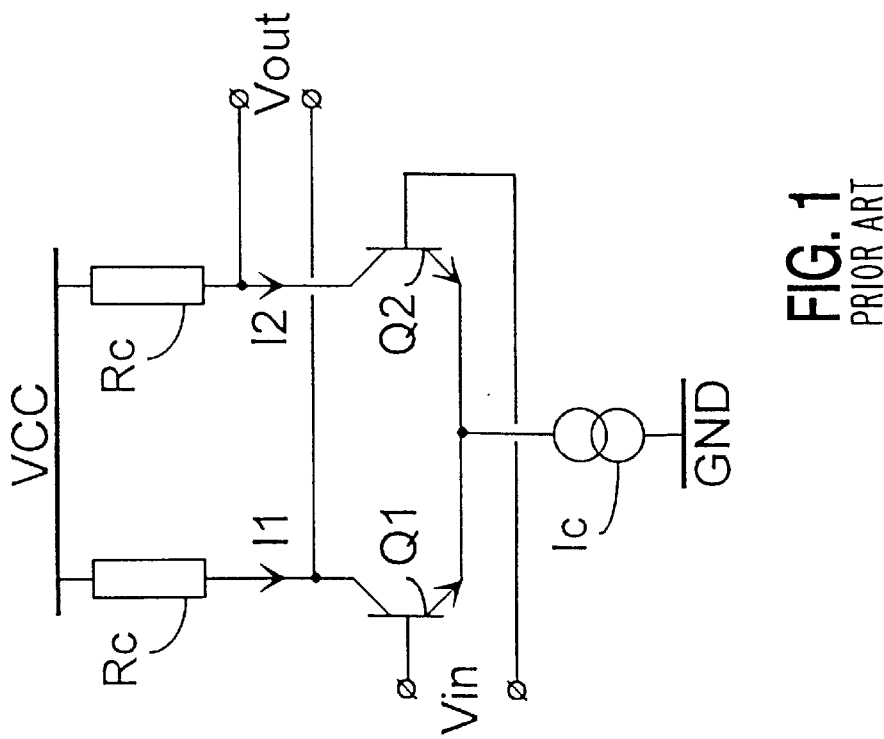
FIG. 1 is an electric circuit diagram describing a known differential amplifier.

FIG. 1 represents a known differential amplifier. This amplifier comprises a first and a second transistor Q1 and Q2 arranged as a differential pair. The transistors Q1 and Q2 are bipolar transistors in this example. Each transistor Q1 or Q2 has a bias terminal formed by its base, a reference terminal, formed by its emitter, connected to a current source which supplies a bias current Ic, and a transfer terminal, formed by its collector, connected to a supply terminal VCC via a resistive branch formed by a charge resistor Rc. The bias terminals and the transfer terminals of the first and second transistors Q1 and Q2 respectively form a differential input and output which are respectively intended to receive and supply an input voltage Vin and an output voltage Vout, a ratio Vout/Vin between the values of said voltages defining the gain G of the amplifier.

It is known that around the state of balance, when considering in a first approximation that the elements that form the differential amplifier are perfect, the gain G of the amplifier is expressed in the form $G=q.Rc.Ic/(2.k.T)$, where q is the charge of the electron, k the Boltzmann constant and T the absolute temperature. Moreover, it is known that the maximum amplitude of the output voltage $Vout_{max}$ is written as $Vout_{max}=Rc.Ic$. It thus appears that the gain G of the amplifier and the maximum amplitude of its output voltage $Vout_{max}$ are both proportional to the product between the resistance Rc and the bias current Ic. If one wishes to perform a transformation function for transforming an input voltage Vin of sinusoidal shape into an output voltage Vout of square-wave shape, the value of the gain G of the amplifier is to be large, that is to say, the value of the product Rc.Ic is to be large. In order not to cause excessive current consumption, one generally opts for an increase of the value of the charge resistance Rc rather than that of the bias current Ic. Be that as it may, the increase of the value of the product Rc.Ic enables to obtain a large gain G but causes the value of the maximum amplitude of the output voltage $Vout_{max}$ to increase. The output voltage Vout is more often than not intended to be used by one or various circuits which are arranged downstream of the amplifier. These circuits have an admissibility, that is to say, a maximum value of the output voltage which is well defined. This means that if the input voltage of one of these circuits exceeds this maximum value, the elements forming the circuit will enter a saturation mode and thus cause deformations to the signals which they are to process. An increase of the gain G effected according to the method described above runs the risk of rendering the maximum amplitude of the output voltage $Vout_{max}$ higher than said admissibility, which will disturb the operation of the whole system integrating the amplifier. Thus, if the maximum amplitude of the output voltage $Vout_{max}$ is fixed at 150 mV, which is a current value for certain present bipolar technologies, the gain G of the amplifier will of necessity be limited to 2.9 which forms a value that is insufficient for correctly realizing the transformation function searched for.

Figure 2:
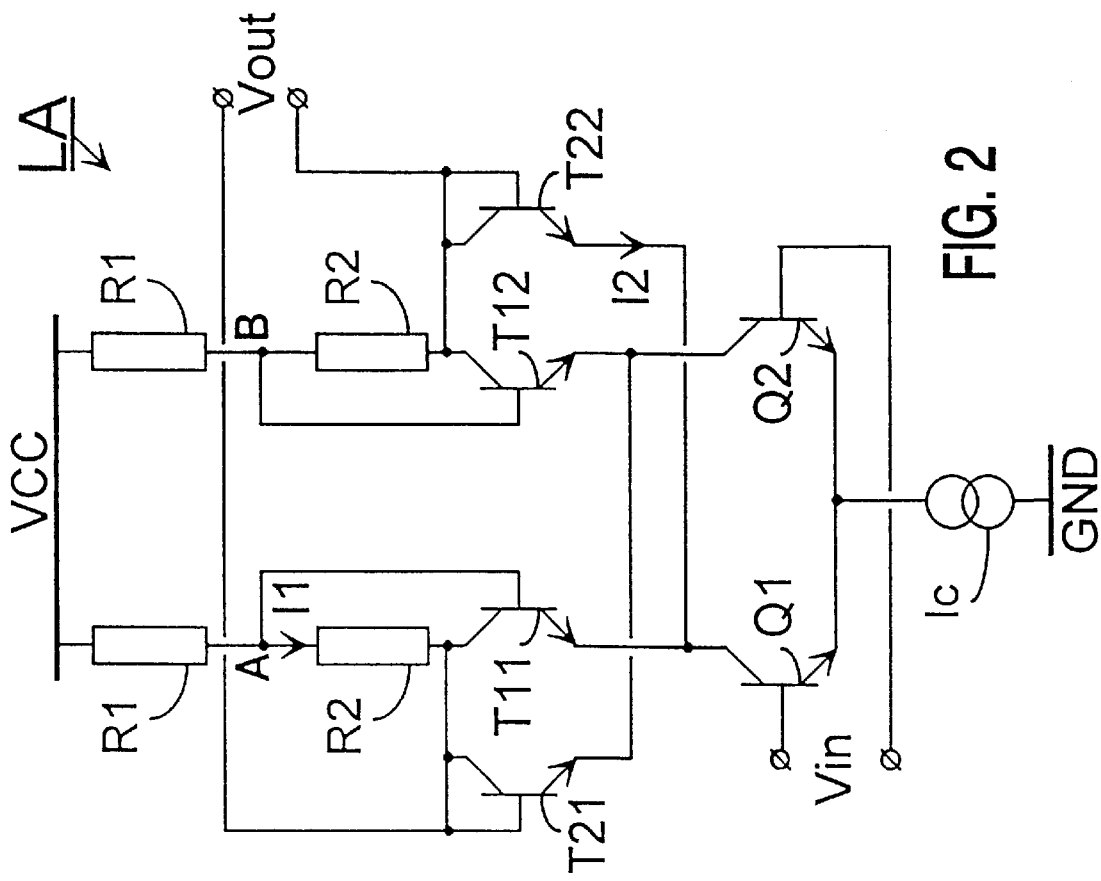
FIG. 2 is an electric circuit diagram describing an amplifier according to an advantageous embodiment of the invention.

FIG. 2 represents an amplifier LA according to the invention. Wherever possible, the common elements of this amplifier and of the differential amplifier described above have been assigned like references so as to facilitate the understanding of the explanation. In this amplifier LA, the resistive branches of the first and second transistors Q1 and Q2 are formed each by a first and a second resistor R1 and R2 connected in series. These resistive branches thus have a first and a second terminal A and B respectively, intermediate between the first and second resistors R1 and R2. The amplifier LA further includes:

- a third transistor T11 whose main current path is inserted between the first transistor Q1 and its associated resistive branch, and a fourth transistor T12 whose main current path is inserted between the second transistor Q2 and its associated resistive branch, the bias terminals of the third and fourth transistors T11 and T12 being respectively connected to the first and second intermediate terminals A and B, and
- a first diode T21 arranged in forward direction between the transfer terminals of the third and second transistors T11 and Q2, and a second diode T22 arranged in forward direction between the transistor terminals of the fourth and first transistors T12 and Q1.

In the example described here, each of the first and second diodes T21 and T22 is formed by a transistor whose bias terminal is connected to its transfer terminal.

By transposing the equation of the gain of the differential amplifier, the gain G of this amplifier LA may be expressed in the form of $G=q.Ic.(R1+R2)/2.k.T$, the resistive branch Rc being formed by the series arrangement of the first and second resistors R1 and R2. In a situation of large unbalance, that is to say, when the absolute value of the input voltage Vin is large, a single one of the first and second transistors Q1 and Q2 of the differential pair is conductive. If one supposes, for example, that the input voltage Vin is positive, the first transistor Q1 will conduct a current of which a part I1 passes through the third transistor T11 and its resistive branch R1, R2, and of which another part I2 passes through the resistive branch R1, R2 of the fourth transistor T12 and then through the second diode T22. There may thus be written: $I1.R1+Vbe(T11)=I2.(R1+R2)+Vbe(T22)$, where $Vbe(Tii)$ represents the base-emitter voltage of the transistor Tii. A dissymmetry in the values of the currents I1 and I2 appears, the current I1 passing through the third transistor T11 being higher than the current I2 passing through the diode T22, because the potential of the bias terminal of the third transistor T11 is higher than that of the bias terminal of the transistor which forms the diode T22. The effects of this dissymmetry in the base-emitter voltages may, however, be neglected, because the base-emitter voltages are low compared with the voltage drops generated in the resistive branches. It may thus be written, in a first approximation, that $I1.R1=I2.(R1+R2)$. Knowing, on the other hand, that $I1+I2=Ic$ in the present hypothesis, according to which only the first transistor Q1 is conductive, one obtains $I1=Ic.(R1+R2)/(2.R1+R2)$ and $I2 =Ic.R1/(2.R1+R2)$. The maximum amplitude of the output voltage is here $Vout_{max}=(R1+R2)(I1-I2)$ which is also written as: $Vout_{max}=Ic.R2.(R1+R2)/(2.R1+R2)$. It thus appears that the gain G of the amplifier and the maximum amplitude of the output voltage $Vout_{max}$ develop differently as a function of the nominal values of the first and second resistors R1 and R2. If the nominal value of the first resistor R1 is chosen to be large compared with that of the second resistor R2, the value of the gain G will be mainly determined by the nominal value of the first resistor R1, whereas the value of the maximum amplitude of the output voltage $Vout_{max}$ will be mainly determined by the nominal value of the second resistor R2.

A numerical example will enable to better appreciate the advantages of such an amplifier: if the value of the bias current Ic is 100 mA, which is a usual value in currently used technologies, and if one chooses $R1=7.5$ k$\Omega$ and $R2=2.5$ k$\Omega$, and with $k.T/q=26$ mV at 300K, according to the preceding equations, a maximum amplitude of the output voltage $Vout_{max}$ of the order of 140 mV would be obtained for a gain G near to 19, which is certainly suitable for realizing the transformation function searched for, while avoiding any risk of saturation for the circuits connected downstream of the amplifier. Such an important gain value would result in a maximum amplitude of the output voltage of the order of 1V in the known differential amplifier, which illustrates well the extent of the limitation of the output voltage obtained thanks to the invention.

If the transistors in the embodiment described with reference to FIG. 2 are transistors of the bipolar type, it is certainly suitable to substitute MOS type transistors for them whose gates, drains and sources will respectively form bias, transfer and reference terminals. In addition, other means than the assembly of the transistors T11, T12 and diodes T21, T22 described with reference to FIG. 2 may be used for realizing the conduction of a current controlled by the intermediate terminal A or B of a resistive branch to its associated transistor Q1 or Q2 when said transistor Q1 or Q2 is conductive, and the conduction of a current to the other transistor Q2 or Q1 of the differential pair when said transistor Q2 or Q1 is conductive. These means are known to a person of ordinary skill in the art and are not beyond the scope of the invention.

Figure 3:
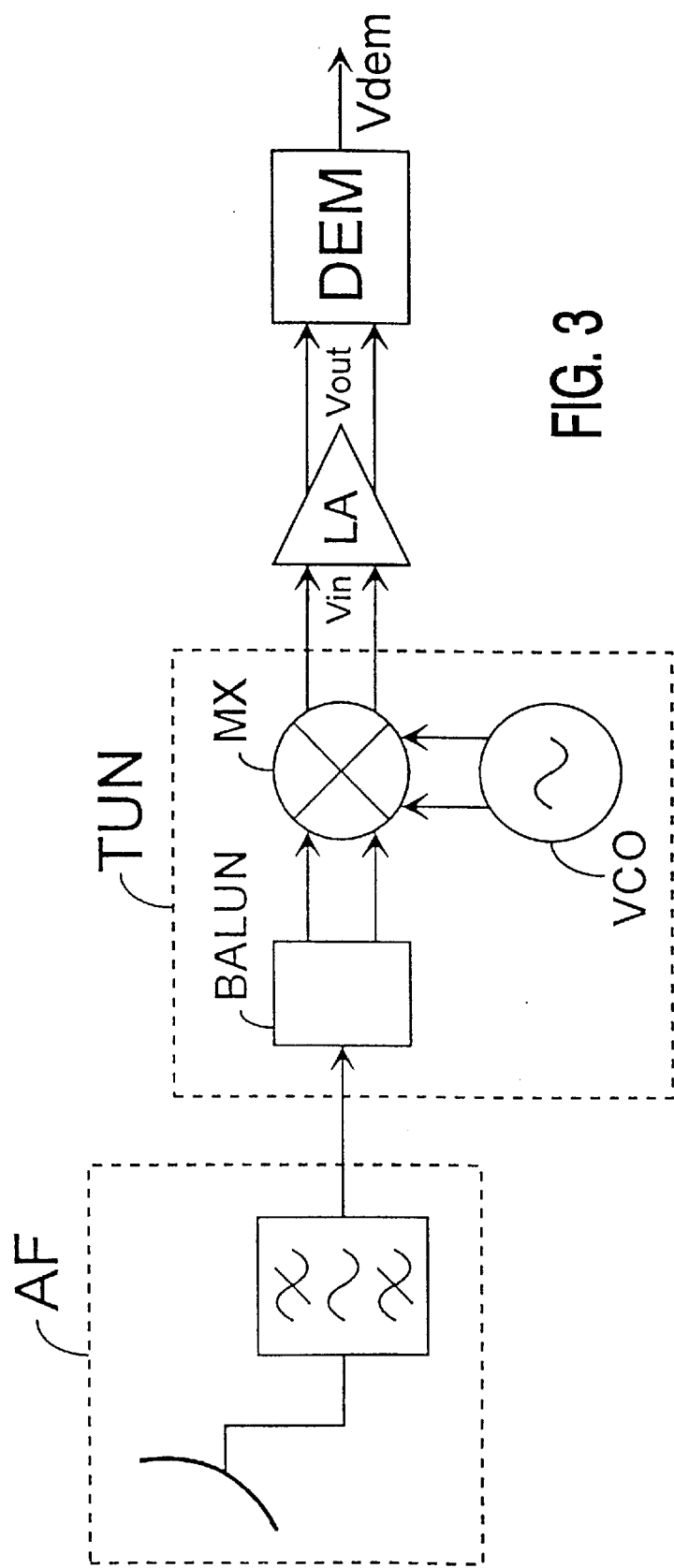
FIG. 3 is an operational diagram describing a radio telephony device which utilizes an amplifier according to the invention.

FIG. 3 partly represents a radio telephony device utilizing an amplifier according to the invention. This device comprises:

- an antenna and filter system AF which enables to receive a frequency-modulated radio signal,
- a selection module TUN comprising a symmetrizer BALUN intended to transform an asymmetrical signal coming from the antenna and filter system AF into a symmetrical signal, an oscillator VCO and a mixer MX, said selection module TUN permitting the selection of the radio signal and being intended to deliver an output signal that represents said radio signal and whose frequency has been converted to an intermediate frequency, a demodulator DEM intended to restore a demodulated audio signal Vdem on the basis of the output signal of the selection module TUN, and an amplifier LA as described above, inserted upstream of the demodulator DEM.

As demonstrated previously, the amplifier LA may present a considerable gain while having a maximum amplitude of its output voltage Vout which is sufficiently low so as not to saturate the input stage of the demodulator DEM. The amplifier LA may thus simultaneously perform an amplification of its input voltage Vin and a transformation of this voltage Vin, which has a sinusoidal shape, into an output voltage Vout that is square-shaped. This transformation enables to avoid that the amplification introduces an additional noise component in the output voltage Vout, which noise component is linked with the instantaneous value of the modulated signal.

What is claimed is:

1. An amplifier comprising a first and a second transistor arranged as a differential pair, each transistor having a bias terminal, a reference terminal connected to a current source and a transfer terminal connected to a supply terminal via a resistive branch, the bias terminals and the transfer terminals of the first and second transistors forming, respectively, a differential input and output, which are intended to receive and supply an input voltage and an output voltage respectively, a ratio between the values of the AC components of said voltages defining the gain of the amplifier, characterized in that the resistive branches of the first and second transistors have each at least one intermediate terminal between a first and a second resistive element arranged in series, and in that each resistive branch is provided with a first element which permits the conduction of a current controlled by the potential of its intermediate terminal to its associated transistor when the latter is conductive, and with a second element which permits the conduction of a current to the other transistor of the differential pair when said other transistor is conductive.

2. An amplifier as claimed in claim 1, characterized in that it comprises:

a third and a fourth transistor whose main current paths are inserted between the first transistor and its associated resistive branch and between the second transistor and its associated resistive branch respectively, the bias terminals of the third and the fourth transistor being respectively connected to the first and the second intermediate terminal, and a first and a second diode arranged in forward direction between the transfer terminals of the third and the second transistor, and between the transfer terminals of the fourth and the first transistor, respectively.

3. An amplifier as claimed in claim 1, characterized in that in each resistive branch, the resistive element which is connected to the supply terminal has a higher resistance value than the other one.

4. An amplifier as claimed in claim 2, characterized in that each of the first and second diodes is formed by a transistor whose bias terminal is connected to its transfer terminal.

5. A radio telephony device, comprising:

an antenna and filter system which enables to receive a frequency-modulated radio signal, a selection module comprising at least an oscillator and a mixer, which selection module permits the selection of said radio signal and is intended to deliver an output signal that represents said radio signal, and whose frequency has been converted to an intermediate frequency, a demodulator intended to restore a demodulated audio signal on the basis of the output signal of the selection module, which device is characterized in that it comprises an amplifier as claimed in claim 1 inserted upstream of the demodulator.

* * * * *